United States Patent [19]

Williams

[11] Patent Number: 4,797,620

[45] Date of Patent: Jan. 10, 1989

[54] HIGH VOLTAGE ELECTROSTATIC SURFACE POTENTIAL MONITORING SYSTEM USING LOW VOLTAGE A.C. FEEDBACK

[76] Inventor: Bruce T. Williams, 454 South St., Lockport, N.Y. 14094

[21] Appl. No.: 898,115

[22] Filed: Aug. 20, 1986

[51] Int. Cl.⁴ ............................................ G01R 29/12
[52] U.S. Cl. ...................................... 324/458; 324/457
[58] Field of Search ................. 324/457, 458, 72, 123; 355/14 CH

[56] References Cited

U.S. PATENT DOCUMENTS

| | | | |
|---|---|---|---|
| 3,852,667 | 12/1974 | Williams et al. | 324/72 |
| 3,997,839 | 12/1976 | Dreyfus et al. | 324/458 X |
| 4,106,869 | 8/1978 | Buchheit | 324/457 X |
| 4,205,267 | 5/1980 | Williams | 324/458 |
| 4,370,616 | 1/1983 | Williams | 324/458 |

*Primary Examiner*—Reinhard J. Eisenzopf
*Assistant Examiner*—Jack B. Harvey
*Attorney, Agent, or Firm*—Christel, Bean & Linihan

[57] ABSTRACT

A non-contacting electrostatic detector comprising a detector electrode sensitive to an electrostatic quantity, a modulator coupled to the electrode for moving the electrode relative to a surface bearing the electrostatic quantity to which the electrode is exposed to produce capacitive modulation of the physical capacitance between the electrode and the surface, and an amplifier having an inverting input serving as a summing node and a non-inverting input, the electrode being connected to the inverting input and the amplifier being connected as a summing amplifier by an impedance connected between the amplifier output and the inverting input. An a.c. voltage signal having a frequency equal to the frequency of the modulator is applied to the non-inverting input of the amplifier. The amplitude and phase of the a.c. voltage signal have values resulting in zero net current flow through the impedance, and the amplitude and phase values are proportional to the magnitude and polarity of the electrostatic quantity on the surface.

32 Claims, 3 Drawing Sheets

HIGH VOLTAGE ELECTROSTATIC SURFACE POTENTIAL MONITORING SYSTEM USING LOW VOLTAGE A.C. FEEDBACK

BACKGROUND OF THE INVENTION

This invention relates to the electrical measurement art, and more particularly to a new and improved apparatus for detection and measurement of electrostatic quantities such as electrostatic fields, electrostatic voltages or electrostatic charges.

Current art electrostatic surface potential monitoring systems employ an electrostatic detector electrode surface which is vibrated in physical relationship to a test surface under measurement to produce a modulated signal, at the frequency of vibration, which is indicative of the test surface potential. In systems achieving high accuracy, which is independent of the detector to test surface separation distance, the detector signal developed is processed by demodulation and integration to produce a feedback signal which is fed back as a reference level for the detector. Using this well known feedback technique, such as disclosed in U.S. Pat. Nos. 3,852,667, 4,205,267, 4,370,616 and others, high accuracy is achieved by driving the voltage difference and therefore the electrostatic field between the detector surface and measurement surface to zero, thus making the measurement accuracy independent of spacing between these two surfaces.

However, a major disadvantage of this voltage/field nulling technique lies with the necessity of producing a feedback voltage level which is the same magnitude as the measured unknown. In electrophotographic applications, a measured surface voltage level of 2 to 3 kilovolts often is required. The requirement of producing high voltage at high speed to follow measured surface voltage variations places a cost restraint in high volume applications for electrostatic surface voltage monitors, such as direct employment in copy machines, or high speed printers, as well as presenting a safety hazard due to high voltage levels in the equipment. In addition, the use of hybrid circuits is impossible in circuitry carrying 2 to 3 kilovolts, thus nullifying the use of this cost reducing manufacturing technique.

SUMMARY OF THE INVENTION

It is, therefore, a primary object of the present invention to provide a new and improved non-contacting electrostatic detector.

It is a further object of the present invention to provide such a detector which eliminates the use of high voltage circuitry in non-spacing dependent high voltage electrostatic surface voltage monitoring devices.

It is a further object of this invention to provide such a detector wherein there is zero displacement current between the detector electrode and the test surface.

It is more particular object of this invention to provide such a detector which will not cause capacitive loading of a test surface to which it is coupled even when the electrostatic field between the detector electrode and the test surface is high.

It is a further object of this invention to provide such a detector which produces spacing independent and accurate high voltage electrostatic surface potential measurements which is small, economical, high bandwidth and provides long life.

It is a further object of this invention to provide such a detector having electronic circuitry for high voltage electrostatic surface monitoring which can be put easily into hybrid form.

The present invention provides a non-contacting electrostatic detector comprising a detector electrode sensitive to electrostatic quantities such as electrostatic fields, voltages, charges and the like, means operatively associated with the electrode for varying the capacitive coupling between the electrode and a surface bearing an electrostatic quantity to which the electrode is exposed, in particular modulator means for moving the electrodde relative to the surface, and an amplifier having first and second inputs and an output, the first input functioning as a summing node and connected to said electrode. The amplifier is connected as a summing amplifier by impedance means connected between the output and the first input in a manner not allowing the voltage from the electrode and appearing in the amplifier to change due to change in capacitance between the electrode and the surface. In particular, the first input of the amplifier is an inverting input and the second input is a non-inverting input.

The modulator means causes a first current to flow through the impedance means in the form of a capacitance displacement current flowing through the capacitance between the electrode and the surface due to the voltage between the electrode and the surface and the change in the capacitance therebetween. There is provided means for applying to the second amplifier input a sinusoidal voltage signal, in particular an a.c. voltage, having a frequency equal to that of the modulator means and having an amplitude and phase producing a second current in the capacitance between the electrode and the surface having a magnitude and phase to cancel the first current. As a result, the ratio between the change in amplitude of the sinusoidal voltage and the magnitude of the electrostatic quantity on the surface is fixed by the ratio of the capacitance between the electrode and the surface and the change in the capacitance whereby the amplitude and phase of the sinusoidal voltage provides information as to the magnitude and polarity of the electrostatic quantity.

The foregoing and additional advantages and characterizing features of the present invention will become clearly apparent upon a reading of the ensuing detailed description together with the included drawing wherein:

DETAILED DESCRIPTION OF THE ILLUSTRATED EMBODIMENTS

Figure 1:
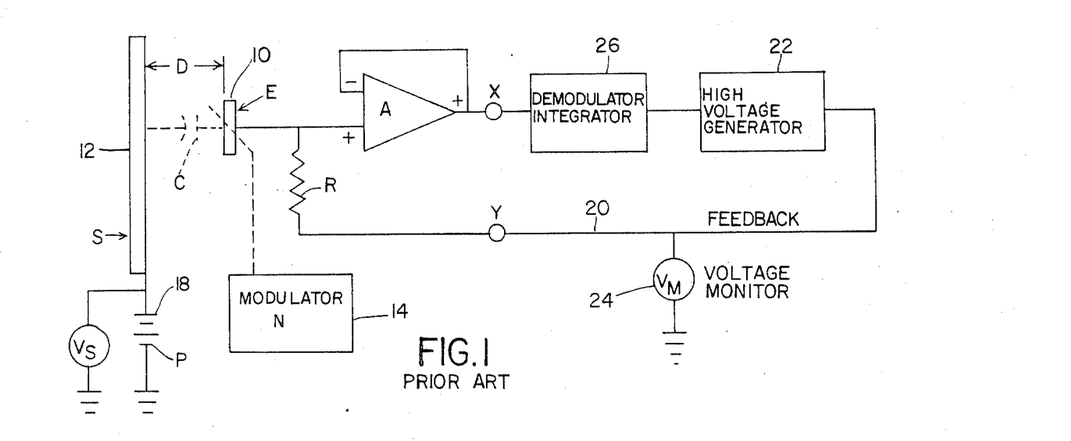
FIG. 1 is a schematic block diagram of a prior art non-contacting electrostatic detector.

FIG. 1 illustrates a prior art non-contacting electrostatic detector wherein a detector electrode E also designated 10 is coupled to and mechanically vibrated relative to surfare under test S also designated 12 by modulator N also designated 14 to produce capacitive modulation $$\frac{dc}{dt}$$

of the physical capacitance C shown in broken lines between surface S and electrode E. If the time constant of C and R, the equivalent resistive load of the electrode E, is long as compared to the peroid of vibration T of electrode E where T=1/frequency of vibration, and terminal Y is referenced to zero volts, as shown by the dotted return line from Y, there will be produced at the output of the buffer amplifier A also designated 16 and point X, a sinusoid voltage waveform whose frequency is the same as the vibration frequency of electrode E and whose amplitude is equal to $$V_s \frac{dc}{dt}.$$

This is shown from the equation of the detector system where $Q_c = CV_c$ where $Q_c$ is the charge stored in capacitance C and $V_c$ is the voltage difference between the detector electrode E and the test surface S. Differentiating relative to time produces the relationship:

$$\frac{dQ_c}{dt} = \frac{Cd}{dt} v_c + V_c \frac{dc}{dt}$$

For convenience, the d/dt term is replaced with $\Delta$ therefore $\Delta Q_c = C\Delta V_c + V_c \Delta C$. $\Delta Q_c$ will be zero because the time constant RC will not allow $Q_c$ to change over the time vibration of electrode E, i.e., $\Delta Q = 9$, and $V_c = V_s$ because electrode E is referenced to ground with point Y grounded. Therefore $$C\Delta V_c = V_c \Delta C, \Delta V_c = V_c \frac{\Delta C}{C}$$

where $\Delta V_c$ is the detector voltage change which is buffered by amplifier A and appears at point X. For example, if surface S is charged by battery P also designated 18 to 1,000 volts ($V_s$) and assuming $C = 10^{-11}$ farads, $\Delta C = 10^{-13}$ farads peak to peak, and $R = 10^{11}$ ohms, there will be produced at the point X a $\Delta V_c$ voltage of $$\Delta V_c = \frac{1000 \cdot 10^{-13}}{10^{-11}} = 10 \text{ volts}$$

peak to peak.

If the dotted ground connection is removed to cause the feedback voltage $V_m$ on line 20 to drive point Y to 1000 volts as produced by the high voltage generator 22, thus reducing the difference voltage $V_c$ to zero, the signal $\Delta V_c$ at point X will reduce to zero. The voltage of the feedback as read on voltage monitor $V_m$, also designated 24 will then be a replica of the surface voltage $V_s$. In systems of this type, the output of the high voltage generator 22 will be automatically adjusted by the output at point X and the demodulator/integrator circuits 26 to cause the signal at point X to be driven to zero. Thus, voltage monitor $V_m$ will follow and represent surface S voltage $V_s$ over wide ranges up to the limit imposed by the voltage capability of the high voltage generator 22.

As D, the distance between surface S and detector E is varied, the equations remain the same with the H.V. generator 22 always producing a voltage $V_m$ to drive $V_c$ and therefore $\Delta V_c$ to zero. It is only necessary at large values of spacing D to have enough gain in the demodulator/integrator circuitry 26 to respond to small values of signal $\Delta V_c$ at point X. Thus voltage $V_m$ follows surface S voltage $V_s$ over wide variations in D by keeping the voltage difference, $V_c$, and therefore the field between surface S and electrode E at zero, i.e., $Q_c = 0$.

Figure 2:
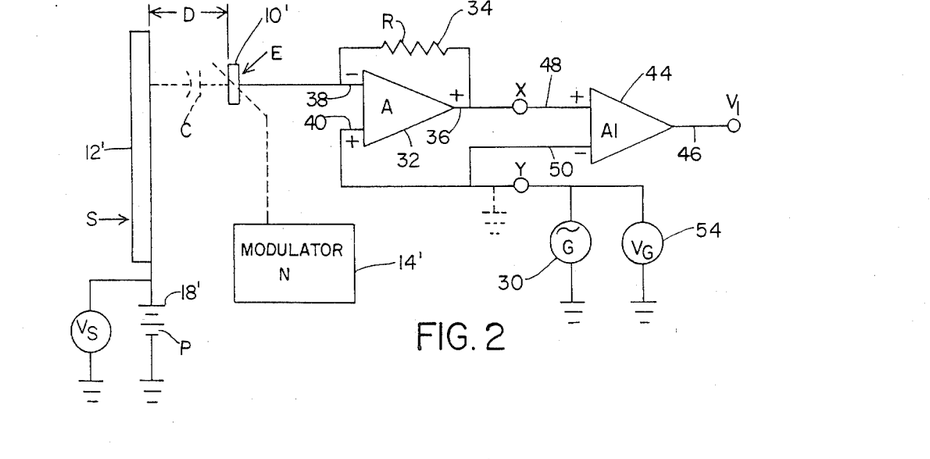
FIG. 2 is a schematic block diagram of a non-contacting electrostatic detector according to the present invention.

In the apparatus of the present invention, one difference is that the high voltage generator is replaced with a sinusoid generator G also designated 30 as shown in FIG. 2. As in the apparatus of FIG. 1, electrode E also designated 10 is physically coupled to and vibrated relative to surface S also designated 12' by modulator N also designated 14' to produce capacitive coupling C and capacitance modulation $\Delta C$. However, in the apparatus of the present invention amplifier A also designated 32 is connected as a summing amplifier by placing impedance means in the form of a resistance R also designated 34 from its output 36 back to the current summing node, the inverting input 38. This connection of R, unlike the connection shown in FIG. 1, will not allow electrode E to produce a $\Delta V_c$ term due to $\Delta C$ because of its connection into the amplifier virtual ground summing node because of the operational characteristics of an amplifier of this type. Additional, A1, a differential amplifier also designated 44, monitors the voltage between the output 36 (point X) and the non-inverting input 40 (point Y) of amplifier A to provide a measurement of the voltage across R and therefore the current through it. The voltage of the inverting input 38 of amplifier A connected to R always follows the voltage of the non-inverting input 40 of amplifier A (point Y) as known to those familiar with amplifiers of these types, and therefore A1 is monitoring the voltage across R. The equation of the detector circuit with point Y grounded, as shown by the dotted line is: $Q_c = CV_c$ and as before $\Delta Q_c = C\Delta V_c + V_c \Delta C$. The detector E voltage $V_c$ over the period of vibration cannot change due to its connection to the summing node 38 of amplifier A, therefore $\Delta V_c = 0$, $C\Delta V_c = 0$ leaving $\Delta Q_c = V_c \Delta C$.

$\Delta Q_c$, a current $I_1$, is a capacitance displacement current which flows through C due to the voltage between electrode E and the surface S and the change of capacitance $\Delta C$ between E and S. This displacement current $I_1$ flows through the feedback resistor R to produce an output signal voltage $V_1$ at output 36 of amplifier A and point X equal to $I_1R$. If the $\Delta C$ term is a sinusoid, the $V_1$ will be a sinusoid whose frequency is identical to the vibration frequency of electrode E and whose amplitude is proportional to the surface S voltage $V_s$ and the magnitude of $\Delta C$. For example if $V_s = 1000$ V as provided by battery P and assuming $C = 10^{-11}$ farads, $\Delta C = 10^{-13}$ farads peak to peak, $R = 10^{11}$ ohm and point Y is returned to ground, there will be produced at point X a $V_1$ voltage of $V_1$ voltage of $V_1 = R[V_c \Delta C] = 10^{11}[1000 \cdot 10^{-13}] = 10^{11} \cdot 10^{-10} = 10$ volts peak to peak. $V_1$ will be a sinusoid equal to the product of R, the source voltage $V_s$, ($V_c$ equals $V_s$ because of the grounded point Y) and $\Delta C$.

If the grounded connection, as shown by the dotted line, at point Y is removed from ground and connected to the sinusoidal voltage generator G, any voltage applied to point Y and thus to the non-inverting terminal 40 of amplifier 32 will appear at the current node, i.e. inverting current node input 38 of amplifier A because of the operational characteristics of an amplifier of this type. With an introduction of the sinusoid voltage signal $V_G$ at the inverting input 38, i.e. current node, of the amplifier 32 due to generator G, a new current, $I_2$, will be generated in the capacitance C between electrode E and surface S. This new current $I_2$ is equal to C, the capacitance between E and S, and $\Delta V_G$ the voltage variation of generator G. The voltage signal $V_G$ is indicated or monitored by component 54. Therefore, $I_2 = C \Delta V_G$. If the frequency of $\Delta V_G$ is identical with the signal from modulator 14' which is producing $\Delta C$, an amplitude and phase (either 0 or 180 degrees relative to modulator 14') of generator voltage, $\Delta V_G$, can be found which will produce an $I_2$ in capacitance C which will exactly cancel the current in the capacitance C due to the surface voltage $V_s$ and the modulation $\Delta C$, i.e., $I_1$.

This equation is thus:

$$\Delta Q_C = C \Delta V_G + V_S \Delta C.$$

$\Delta Q_c = I$ total $= I_2 + I_1 = 0$ if $I_2$ and $I_1$ are equal and opposite currents.
$I_2 = C \Delta V_G$
$I_1 = V_c \Delta C$
if
$I_2 = I_1$
then $$C \Delta V_G = V_c \Delta C$$

$$\frac{\Delta V_G}{V_s} = \frac{\Delta C}{C}$$

Therefore, the ratio between $\Delta V_G$, an A.C. signal, and the surface voltage $V_s$, a D.C. level, is fixed by the ratio of $$\frac{\Delta C}{C},$$

the ratio of the capacitance C of the detector electrode E and surface S and the change in that capacitance $\Delta C$ due to the motion of electrode E.

It can be shown that as a function of D, the electrode E to surface S spacing the ratio of $$\frac{\Delta C}{C}$$

stays constant for any fixed peak to peak motion of electrode E and therefore the ratio between $V_G$, the generator G voltage, and the measured surface voltage $V_s$ remains constant for any spacing D to achieve the sum of $I_2$ and $I_1$ equal to zero. It will be noted that the difference between $I_2$ and $I_1$ will flow through R and produce a voltage $V_1$ at amplifier A output 36 which appears at terminal X. This voltage which is equal to $(I_2 - I_1)R$ can be differentially amplified in amplifier A1 and used to produce the necessary voltage at point $V_1$ to feed back an amplified signal into terminal Y to replace generator G, thus producing $V_{F.B.} = V_G$. The closed loop system thus produced will cause the $I_2 - I_1$ term to be driven to zero, thereby fixing the proportionality between the A.C. feedback signal $V_{F.B.}$ and the measured surface voltage $V_s$ as a constant.

Figure 3:
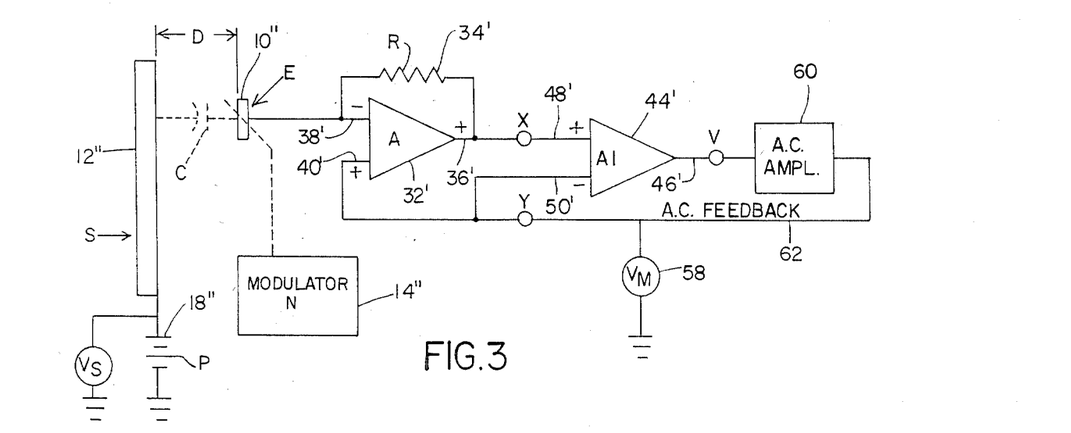
FIG. 3 is a schematic block diagram of a non-contacting electrostatic detector according to another embodiment of the present invention.

In the embodiment of FIG. 3, a feedback system is illustrated where $V_m$ also designated 58 is an indicator (oscilloscope, A.C. voltmeter, etc.) used to indicate accurately the value of test surface voltage $V_s$ regardless of spacing D variation by monitoring the value of $V_{F.B.}$. The output of amplifier 44' is applied to the input of an a.c. amplifier 60, the output of which is the a.c. feedback signal, and is applied by line 62 to Y and thus to terminal 40' of amplifier 32'. The a.c. amplifier 60 is a tuned amplifier having a bandpass characteristic around a frequency equal to the rate of the capacitance modulation.

In another embodiment of an apparatus of this invention, a feedback technique is employed to reduce the effects of fast or large signals which may be applied to the test surface S that may tend to overload the high gain amplifier stages or cause instability. In this embodiment illustrated in FIG. 4, the signal produced as $V_1$ by a difference between $I_1$ and $I_2$ not equal to zero is demodulated by DM, a phase sensitive demodulator also designated 68 which uses the voltage at point Z from modulator 14" as a reference phase. The voltage at point Z is correlated in frequency and phase with the motion of detector electrode E and therefore to the $\Delta C$ term. The demodulation process will produce D.C. signal $V_2$ at the output of demodulator 68 which is proportional to the $I_2 - I_1$ difference. The polarity of this D.C. signal $V_2$ due to the demodulation process will indicate the absolute difference between $I_2$ and $I_1$, i.e., whether $I_2$ is greater or less than $I_1$. The demodulator stage DM, also designated 68, obtains a phase and reference signal from the modulator 14" at point Z via line 70 to insure that only the signal components which are correlated in frequency and phase with the $\Delta C$ term are demodulated by DM, thus providing excellent noise rejection and overload protection of the system.

Figure 4:
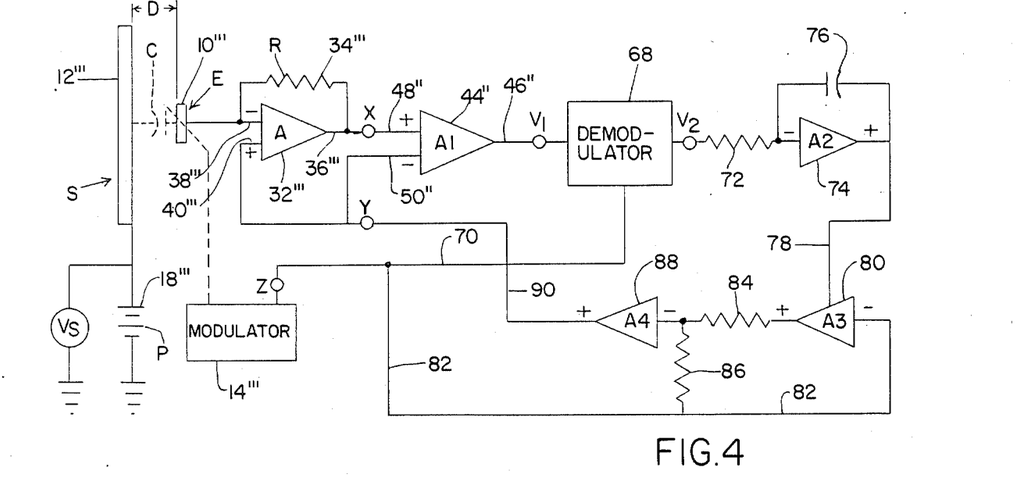
FIG. 4 is a schematic block diagram of a non-contacting electrostatic detector according to another embodiment of the present invention.

The output of the demodulator 68, a D.C. level whose polarity indicates absolute difference between the $I_2$ and $I_1$ sinusoids, is applied through a resistor 72 to the input of amplifier A2, a high gain integrating amplifier also designated 74 having capacitor 76 connected between output and input. The time constant of integrator A2 is chosen to be consistent with system noise and speed performance as well as insuring system stability. The output of amplifier A2 is connected by line 78 to the D.C. control terminal of an amplifier A3, a variable gain inverting amplifier also designated 80. The input to amplifier A3 is derived from modulator 14" at point Z by line 82, the signal which is frequency and phase correlated with the $\Delta C$ modulation. The output of amplifier A3, a variable amplitude, 180 degree phase shifted signal relative to point Z, is applied through resistor 84 and summed with a signal derived directly from point Z via line 82 and a resistor 86 into A4, a summing amplifier also designated 88. The output of amplifier A4, therefore, is a variable amplitude signal whose phase relative to point Z is either at 0° or 180° as dictated by the D.C. output of amplifier A2. The output of amplifier A4 on line 90 applied directly back as a feedback reference $V_{F.B.}$ to the detector electrode E via point Y and the non-inverting input 40" of amplifier A. The closed loop system thus generated will null the signal V, by summing the currents generated in R due to $V_s \Delta C$ and $C \Delta V_{F.B.}$ to zero thus providing the required proportional relationship between $\Delta V_{F.B.}$ and $V_s$. It will be noted that if currents in R are summed to zero, then the displacement current between electrode E and surface S is also zero, which is a prime objective of this invention.

As an example, suppose for this instant a surface voltage $V_s$ of 0 volts D.C. is applied and also that the sinusoid at $V_{F.B.}$ is zero. There will be generated in the detector no current due to $V_s \Delta C$ and no opposing current generated by $V_{F.B.}$. The sinusoid at point $V_1$ will be zero, the output of demodulator DM at $V_2$ will be zero, and the output of integrator A2 will be at the D.C. value required to cause the summed value of the output of amplifier A3 and point Z voltage in amplifier A4 to produce a zero value of $V_{F.B.}$. This is a stable closed loop condition. If we now apply a D.C. voltage of +1000 volts to surface S from battery P as indicated by $V_s$, a sinusoid will appear at $V_1$ in response to the current in the detector of $V_s \Delta C$. The $V_1$ signal is demodulated into D.C. voltage $V_2$ which causes the integrator A2 to move from its previous voltage level at $V_s=0$ to a new D.C. level to cause the output of amplifier A4 to generate a new value of A.C. feedback, i.e. $V_{F.B.}$. This will produce a current in the detector circuit $V_{F.B.}C$ to null the $V_s \Delta C$ current to produce again a null in the $V_1$ voltage. This causes the output of the demodulator 68 to reduce to zero and therefore the D.C. output of amplifier A2 will hold at the particular D.C. value which caused $V_{F.B.}$ to produce the exact value of A.C. feedback necessary to again null the $V_1$ voltage. The value of $V_{F.B.}$ is directly proportional to $V_s$, with the proportionality constant being equal to $$\frac{\Delta C}{C}.$$

If we now vary (D), the detector E to surface S spacing, $V_{F.B.}$ will remain constant.

To insure that the relationship between C to $\Delta C$ remains constant over a wide range of temperature, time, air pressure, etc., it is necessary to keep the peak to peak mechanical excursion of detector surface E constant. This is accomplished by driving the detector surface E with a motion generator which has stable drive characteristics with a constant drive signal. Or alternately, a peak to peak detector motion measurement technique can be employed and then this measurement used to correct the drive signal amplitude to cause constant peak to peak motion in a closed loop fashion. This second method is preferred due to the effects of stray mechanical coupling which may tend to change the peak to peak detector motion even when driven by a constant amplitude drive signal.

Figure 5:
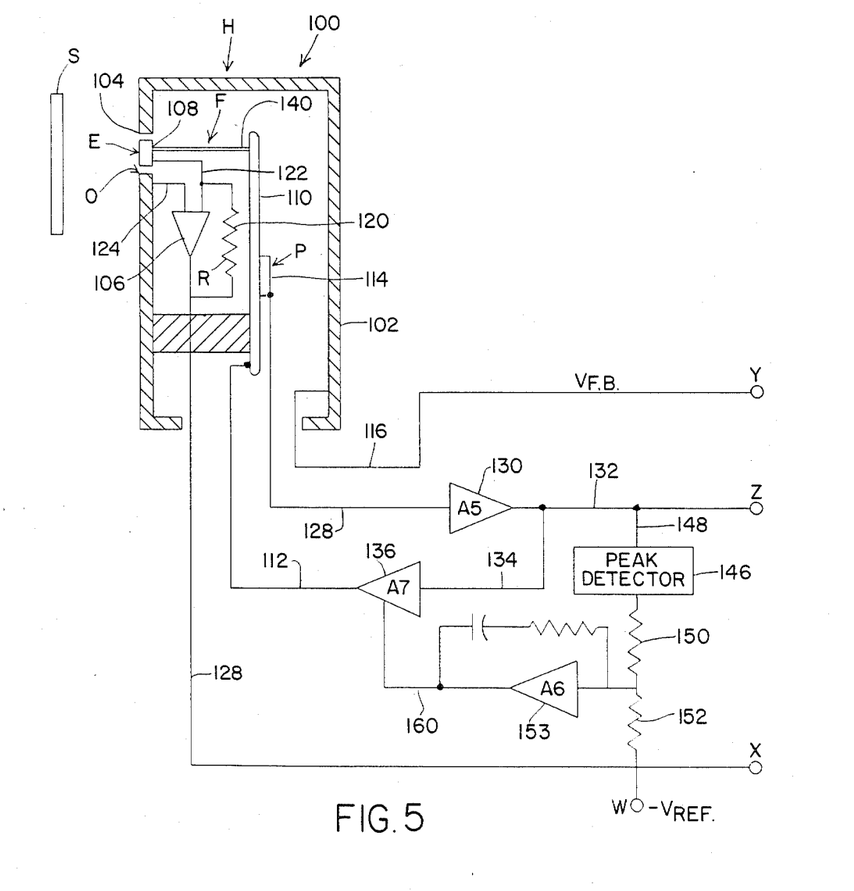
FIG. 5 is a schematic block diagram, partly diagrammatic, of a probe for the non-containing electrostatic detector according to the present invention.

FIG. 5 shows a probe, generally designated 100, of the non-contacting electrostatic detector of the present invention. The probe includes a housing H of conductive material, also designated 102, provided with an opening or aperture O, also designated 104, adapted to face toward the test surface S. The probe 100 contains or carries amplifier A also designated 106, the detector surface E, also designated 108 and motion generator L, also designated 110. Alternatively the amplifier A could be mounted external to the probe to provide for size reduction of the probe assembly with a smaller pre-amp inside the probe. The motion generator L is employed to convert electrical signals on line 112 from the modulator drive into mechanical motion to cause detector electrode E to vibrate relative to surface S through aperture O. Generator L is constructed of a piezo-electric transducer element. Alternately, an electro-magnetic device would work equally well. Sensing means in the form of a second piezo-electric transducer element P also designated 114 is coupled to the motion of detector element E to measure its peak to peak excursion by monitoring the motion of generator L, the detector E being mounted directly to L. The element P could also be an electro-magnetic device.

The output of element P, if tightly coupled mechanically to the detector element E, will provide information regarding the variation of position of electrode E relative to time, i.e. frequency and phase information, and therefore the output of transducer P can be used as a source for the generator G element of FIG. 2 and source of signal for point Z in the arrangement of FIG. 4. Additionally, the output of transducer P can be used to control the amplitude of the drive signal applied to motion generator L to provide for constant peak to peak excursion of detector element E. This insures a fixed ratio between C and $\Delta C$ to provide a fixed proportionality between $V_s$, the D.C. surface voltage, and $V_{F.B.}$, the A.C. feedback signal. The control circuitry shown in FIG. 5 associated with probe 100 produces a constant ratio of C to $\Delta C$ as well as providing the necessary control signals required to operate the system. The probe housing 102 of conducting material is connected by line 116 to point Y to apply the $V_{F.B.}$ signal from amplifier A4 in the arrangement of FIG. 4 to amplifier A in probe 100. Amplifier A, with resistor R, also designated 120, is connected as a summing amplifier as in FIGS. 2–4. The inverting input of amplifier A is connected by lead 122 to electrode 108, and the non-inverting input is connected by lead 124 through housing 102 to wire 116. The output of amplifier A is connected by line 126 to point X and thus to the input 48' of amplifier A1 in FIG. 4. Element P, shown here as a separate piezo-electric chip, can alternately be constructed as an integral part of piezo-electric element L by isolating a section of L and making a separate electrical connection to the isolated section.

Sensing element P is shown in FIG. 5 connected by line 128 to amplifier A5 also designated 130 to obtain an output from amplifier A5 which is a measure of the motion of detector electrode E and therefore is in frequency and phase correlation with $\Delta C$. The output of amplifier A5 is connected by line 132 to point Z. The output of amplifier A5 is connected by line 134 into amplifier A7 also designated 136, a D.C. gain controlled amplifier. The output of amplifier A7 is connected to drive element L by line 112 to provide drive signals to element L to produce motion of detector element E which is connected to element L via insulating support member F also designated 140. The circuit connection of transducer P back into generator L through amplifiers A5 and A7 will provide a gain controlled (by amplifier A7) feedback loop to cause oscillation (motion) of generator L at its mechanical resonate frequency.

To stabilize and fix the amplitude of the output of amplifier A5 and therefore the amplitude of the peak to peak motion of generator L and detector E, the output of amplifier A5, which is representative of the motion of the detector, is peak detected in a peak detector 146 and compared with a reference voltage applied to point W. In particular, the input of peak detector 146 is connected by line 148 to line 132 from amplifier 130, and the output of detector 146 is on resistor 150. Reference voltage $-V_{REF}$ is on resistor 152, the two resistors 150,152 being connected in series to form a voltage divider. Any error in the compared values of the peak value of A5 output and the reference level at W appears at the junction of resistors 150,152 and is applied to the input of an amplifier A6, also designated 158, where it is integrated to produce a D.C. control signal on line 160 for amplifier A7. In this way, amplitude control is achieved to hold the peak to peak motion of electrodes E fixed and therefore the ratio of ΔC to C, fixed, regardless of extraneous factors, such as probe mechanical mounting, air density changes causing air loading of the element L and detector E or resonate effects of element L.

In prior art electrostatic surface voltage monitoring systems using conventional probes and high voltage D.C. feedback, a high ratio of ΔC to C is necessary to maintain a high signal to noise ratio at the output of A and point X (of FIG. 1) particularly at large value of detector E to surface S spacings D. This requirement reduces dramatically the life expectancy of the motion producing source of detector E due to mechanical wear or, in the case of piezo-electric motion sources, life is reduced due to depoling and/or mechanical stress. However, in the probe of the present invention the excursion of the detector E is kept small to provide a known and fixed ratio of ΔC to C of, for instance, 500 to 1. With this small ratio, the A.C. feedback $V_{F.B.}$ required to accurately measure a 3 kilovolt value of $V_s$ is 6 volts peak to peak, a value well within the range of hybrid circuits using ordinary monolithic amplifiers. This small C, and therefore small motion of detector E, results in much less wear and stress of the motion producing system in the probe. In addition, because of smaller ratio of ΔC to C of the detector E of the present invention, higher operating frequencies of the detector electrode E can be accommodated to increase system measuring bandwidth.

The output of amplifier A4($V_{F.B.}$) in the arrangement FIG. 4 and present on line 116 in FIG. 5 is an A.C. signal proportional to the test surface voltage $V_s$ and therefore can be read on an oscilloscope, A.C. meter, or other A.C. responsive device. This signal, $V_{F.B.}$ can also be rectified and filtered to obtain a D.C. voltage proportional to surface voltage $V_s$. In addition, to obtain output information which is responsive to the polarity of surface voltage $V_s$ (i.e., plus or minus), $V_{F.B.}$ can be processed by a demodulator similar to DM in FIG. 4 using signal Z as a reference phase. This technique will also improve the noise rejection of the monitoring system to noise appearing on surface S as well as system generated noise.

Figure 6:
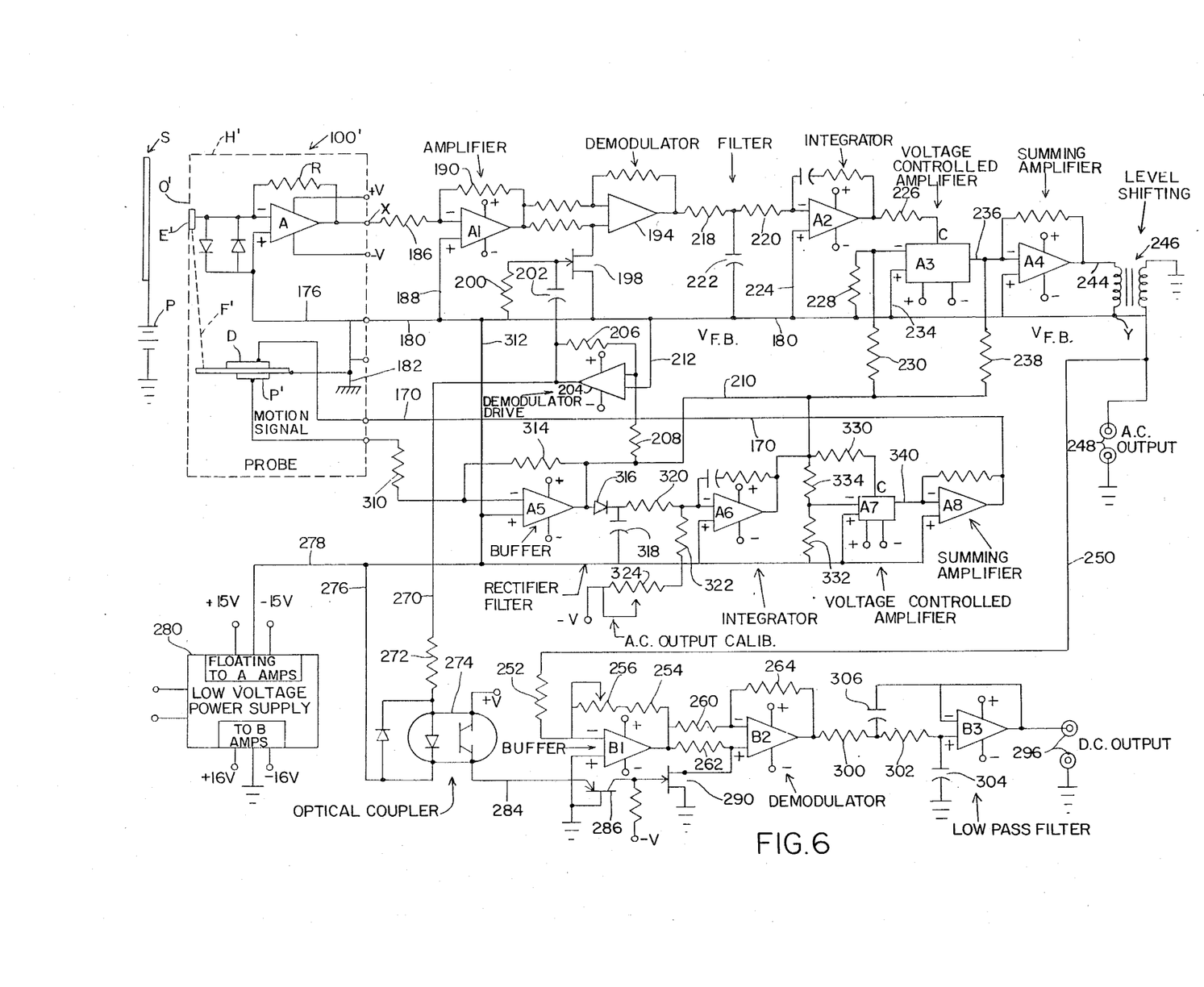
FIG. 6 is a schematic circuit diagram of a non-contacting electrostatic detector according to the present invention.

FIG. 6 is a schematic circuit diagram of a non-contacting high voltage electrostatic surface potential monitoring system using low voltage a.c. feedback according to the present invention. The system includes a probe similar to that shown in FIG. 5 and designated 100'. Electrode E' is driven by element L' which, in turn, is vibrated by a drive transducer D in response to a drive signal on line 170. A sensing means or transducer P' develops a motion signal on line 172. Transducers D and P' can be piezoelectric. Amplifier A is connected as a summing amplifier as in the previous arrangements, and resistor R by way of illustration has a magnitude of 22 megohms. The non-inverting input of amplifier A is connected by a line 176 to a line 180 on which the a.c. feedback signal is present as will be described and which is connected to a floating or internal reference point designated 182. The output of amplifier A, designated point X, is applied through a resistor 186 to the negative input terminal of amplifier A1, similar to amplifier A1 in the previous embodiments, and the positive input terminal is connected by line 188 to line 180. A feedback resistor 190 is connected from the output of amplifier A1 to the negative input terminal. By way of example, in an illustrative apparatus, resistor 186 has a magnitude of 10K and resistor 190 a magnitude of 470K.

The output of amplifier of A1 is connected through a pair of resistors to the negative and positive input terminals of an amplifier 194 serving as a demodulator, DM, as in the previous embodiments. The output of amplifier 194 is connected to the negative input terminal through a feedback resistor. By way of example, in an illustrative apparatus the input resistors as well as the feedback resistor each has a magnitude of 22K. A drive signal is applied to the positive input terminal of amplifier 194 by the following arrangement. The source-drain circuit of a field effect transistor 198 is connected between line 180 and the positive input terminal of amplifier 194. The gate terminal of transistor 198 is connected through a resistor 200 to line 180 and through a capacitor 202 to the output of an amplifier 204. A feedback resistor 206 is connected between the output and one input of amplifier 204. This same input is connected through a resistor 208 to a line 210 containing an amplified version of the motion signal from line 172 as will be described. The other input of amplifier 204 is connected by a line 212 to line 180. By way of example, in an illustrative circuit, field effect transistor 198 is type J110, resistor 200 has a magnitude of 1 megohm, capacitor 202 has a magnitude of 0.02 microfarads, resistor 206 has a magnitude of 4.7 megohms and resistor 208 has a magnitude of 47K.

The output of amplifier 194 of the demodulator is connected to a filter comprising the series combination of resistors 218 and 220, the junction of which is connected by capacitor 222 to line 180. By way of example, in an illustrative circuit, resistors 218 and 220 have magnitudes of 10K and 100K, respectively, and capacitor 222 has a magnitude of 0.1 microfarads. The filter is connected to the negative input terminal of integrator amplifier A2 which is similar to amplifier to A2 in the arrangement of FIG. 4. The positive input terminal of amplifier A2 is connected by line 224 to line 180. By way of example, in an illustrative circuit, the output of amplifier A2 is connected to a 100K resistor which is connected through a 0.01 microfarad capacitor to the negative input terminal. The output of amplifier A2 is connected through a resistor 226 to the control terminal of a voltage controlled amplifier A3 similar to amplifier A3 in the arrangement of FIG. 4. The negative input terminal of amplifier A3 is connected through a resistor 228 to line 180 and through a resistor 230 to line 210. The positive input terminal of amplifier A3 is connected by line 234 to line 180. By way of example, in an illustrative circuit, resistor 226 has a magnitude of 15K, resistor 228 has a magnitude of 100 ohms and resistor 230 has a magnitude of 22K.

The output of amplifier A3 is connected by line 236 to the negative input terminal of summing amplifier A4 similar to amplifier A4 in the arrangement of FIG. 4, and the output of amplifier A3 also is connected through a resistor 238 to line 210. The positive input terminal of amplifier A4 is connected by line 240 to line 180. By way of example, in an illustrative circuit, resistor 238 has a magnitude of 22K, and the output of amplifier A4 is connected through a resistor having a magnitude of 22K to the negative input terminal of amplifier A4. The output of amplifier A4, the feedback voltage $V_{F.B.}$, is present on line 244 and is applied to the primary winding of a level shifting transformer 236, the secondary winding of which is connected between ground and a pair of a.c. output terminals 248. The other terminals of the primary winding of transformer 246 is designated point Y which is similar to point Y in the circuit of FIG. 4. The a.c. feedback voltage, $V_{F.B.}$, is present at point Y and on line 180. As previously described the a.c. output at terminals 248 is an a.c. signal proportional to the voltage $V_s$ on test surface SS, and therefore can be read on an oscilloscope, a.c. meter or other a.c. responsive device.

The signal $V_{F.B.}$ can also be rectified and filtered to obtain a d.c. voltage proportional to the surface voltage $V_s$. In the circuit of FIG. 6, to obtain output information which is responsive to the polarity of surface voltage $V_s$, the feedback voltage $V_{F.B.}$ can be processed by a demodulator similar to DM in the arrangement of FIG. 4 using a signal comparable to that of point Z as a reference phase. This also improves the noise rejection of the monitoring system to noise appearing on the surface S as well as system generated noise. In particular, the voltage at point Y is applied through a line 250 and a resistor 252 to the negative input terminal of a buffer amplifier B1. The positive input terminal of amplifier B1 is connected to ground and the output is connected through the series combination of a resistor 254 and potentiometer 256 to the negative input terminal. Potentiometer 256 provides d.c. output calibration. By way of example, in an illustrative circuit, resistor 254 has a magnitude of 33K and resistor 256 has a magnitude of 20K. The output of amplifier B1 is connected through resistors 260 and 262 to the negative and positive input terminals, respectively of an amplifier B2 of a demodulator stage. A signal comparable at that in point Z in the previous circuits is applied to the positive input terminal of amplifier B2 as a reference phase by the following arrangement. The output of amplifier 204 is connected by line 270 through a resistor 272 to an optical coupler 274. Coupler 272 also is connected by a line 276 to the output line 278 of the system power supply 280. The output of coupler 274 is connected by line 284 to the emitter of a PNP transistor 286, the base terminal of which is connected to ground and the cathode terminal of which is connected to the gate terminal of a field effect transistor 290. The gate terminal of transistor 290 also is connected through a resistor 292 to a negative voltage level −V. The source-drain circuit of field effect transducer 290 is connected between the positive input terminal of amplifier B2 and ground. By way of example, in an illustrative circuit, resistor 272 has a magnitude of 6.8K, resistor 292 has a magnitude of 22K, field effect transistor 290 is type J110, and the voltage levels +V and −V are 16 volts.

The output of demodulator amplifier B2 is applied to the input of a low pass filter stage, the output of which is connected to d.c. output terminals 296. In particular, the filter includes an amplifier B3, and the output of amplifier B2 is connected through the series combination of resistors 300,302 to the positive input terminal of amplifier B3 which also is connected to a capacitor 304 to ground. The output of amplifier B3 is connected directly to the negative input terminal of amplifier B3, which, in turn, is connected through a capacitor 306 to junction of resistors 300,302. By way of example, in illustrative circuit, resistors 300 and 302 have magnitudes each of 470K, capacitor 304 has a magnitude of 0.001 microfarad, and capacitor 306 has a magnitude of 0.01 microfarad.

The drive signal on line 170 is derived in the following manner. The motion signal on line 172 is applied through a resistor 310 to the negative input terminal of an amplifier A5 similar to that in the arrangement of FIG. 5. The positive input terminal of amplifier A5 is connected to a line 312 connected between lines 278 and 180. The output of amplifier A5 is connected through a resistor 314 to the negative input terminal of the amplifier and is also connected to line 210. By way of example, in an illustrative circuit, resistor 310 has a magnitude of 47K and resistor 314 has a magnitude of 470K. The output of buffer amplifier A5 is connected to a rectifier/filter stage comprising a diode 316, the anode of which is connected to the amplifier A5 and the cathode of which is connected through a capacitor 318 to line 278. The cathode of diode 316 also is connected through the series combination of resistors 320 and 322 to a potentiometer 342 providing a.c. output calibration. By way of example, in an illustrative circuit, capacitor 318 has a magnitude of 0.22 microfards, resistor 320 a magnitude of 100K, resistor 322 a magnitude of 150K, and potentiometer 324 a magnitude of 20K which is connected to a source of negative reference voltage having a magnitude of 15 volts.

The output of the rectifier filter stage is connected to an integrator. In particular, the junction of resistors 320 and 322 is connected to the negative input terminal of integrator amplifier A6 similar to that in the arrangement of FIG. 5. The positive input terminal of amplifier A6 is connected to line 278. The output of amplifier A6 is connected through the series combination of a resistor and the capacitor to a negative input terminal therof. By way of example, in an illustrative circuit, the resistor has a magnitude of 10K and capacitor of magnitude of 0.1 microfarads. The output of integrator amplifier A6 is connected through a resistor 330 to the control terminal of a voltage controlled amplifier A7 similar to that in the arrangement of FIG. 5. The negative input terminal of amplifier A7 is connected through a resistor 332 to line 278 and through a resistor 334 to line 210. The positive input terminal of amplifier A7 is connected by line 336 to line 178. By way of example, in an illustrative circuit, resistor 330 has a magnitude of 15K, resistor 332 a magnitude of 100 ohms, and resistor 334 a magnitude of 22K. The output of voltage controlled amplifier A7 is connected by line 340 to the negative input terminal of a summing amplifier A8 similar to that in the arrangement of FIG. 5. The positive input terminal of amplifier A8 is connected to line 278, the output is connected through a resistor to the negative input terminal thereof and is also connected to line 170. By way of example, in an illustrative circuit, this resistor has a magnitude of 22K.

It is therefore apparent that the present invention accomplishes its intended objects. While embodiments of the present invention have been described to detail, that is done for the purpose of illustration, not limitation.

I claim:

1. A non-contacting electrostatic detector comprising:
   (a) a detector electrode sensitive to electrostatic quantities such as electrostatic fields, voltages and charges;

(b) means operatively associated with said electrode for varying the capacitive coupling between said electrode and a surface bearing an electrostatic quantity to which said electrode is exposed;

(c) an amplifier having first and second inputs and an output, said first input functioning as a summing node;

(d) means for connecting said electrode to said first input of said amplifier;

(e) said amplifier being connected as a summing amplifier by impedance means connected between said output and said first input in a manner not allowing the voltage from said electrode and appearing in said amplifier to change due to change in capacitance between said electrode and said surface;

(f) said means for varying the capacitive coupling causing a first current to flow through said impedance means in the form of a capacitance displacement current flowing through the capacitance between said electrode and said surface due to the voltage between said electrode and said surface and the change in the capacitance between said electrode and said surface; and (g) means for applying to said second input of said amplifier a sinusoidal voltage signal having a frequency equal to that of said capacitance varying means and having an amplitude and phase producing a second current in the capacitance between said electrode and said surface having a magnitude and phase to cancel said first current so that the ratio between the change in amplitude of said sinusoidal voltage and the magnitude of the electrostatic quantity on said surface is fixed by the ratio of the capacitance between said electrode and said surface and the change in said capacitance;

(h) whereby the amplitude and phase of said sinisoidal voltage provides information as to the magnitude and polarity of said electrostatic quantity.

2. An electrostatic detector according to claim 1, wherein said first input of said amplifier is an inverting input and said second input of said amplifier is a non-inverting input.

3. An electrostatic detector according to claim 1, wherein said means for varying the capacitive coupling comprises modulator means for mechanically vibrating said electrode to produce capacitance modulation.

4. An electrostatic detector according to claim 3, wherein the time constant of the equivalent resistive load of said electrode is short as compared to the period of vibration of said electrode to provide for generation of a detector current.

5. An electrostatic detector according to claim 1, further including means for monitoring the voltage between said output and said second input of said amplifier.

6. An electrostatic detector according to claim 5, wherein said monitoring means comprises a differential amplifier having first and second inputs and an output, said first input being connected to the output of said summing amplifier, said second input being connected to the second input of said summing amplifier, whereby the voltage at said output of said differential amplifier is sinusoidal having a frequency equal to the rate at which said capacitive coupling is changed and having an amplitude proportional to the magnitude of the electrostatic quantity on said surface and the change in capacitance between said surface and said electrode.

7. An electrostatic detector according to claim 1, further including means connected to said means for applying a sinusoidal voltage signal to monitor the amplitude of said signal.

8. A non-contacting electrostatic detector comprising:

(a) a detector electrode sensitive to electrostatic quantities such as electrostatic fields, voltages and charges;

(b) modulator means operatively coupled to said electrode for moving said electrode relative to a surface bearing an electrostatic quantity to which said electrode is exposed to produce capactive modulation of the physical capacitance between said electrode and said surface;

(c) an amplifier having first and second inputs and an output, said first input being an inverting input serving as a summing node and said second input being a non-inverting input;

(d) means for connecting said electrode to said first input of said amplifier;

(e) said amplifier being connected as a summing amplifier by an impedance connected between said output and said first input; and (f) means for applying an a.c. voltage signal to said second input of said amplifier, said a.c. voltage having a frequency equal to the frequency of said modulator means;

(g) whereby when the amplitude and phase of said a.c. voltage signal have values resulting in zero net current flow through said impedance, said amplitude and phase values are proportional to the magnitude and polarity of said electrostatic quantity on said surface.

9. An electrostatic detector according to claim 8, wherein said impedance is connected to the virtual ground summing node of said amplifier so as not to allow said electrode to produce at said amplifier input a voltage change due to change in capacitance between said electrode and said surface.

10. An electrostatic detector according to claim 9, wherein said modulator means causes a first current to flow through said impedance in the form of a capacitance displacement current flowing through the capacitance between said electrode and said surface due to the voltage between said electrode and said surface and the change in the capacitance between said electrode and said surface.

11. An electrostatic detector according to claim 10, wherein said amplitude and phase of said a.c. voltage signal have values producing a second current in the capacitance between said electrode and said surface having a magnitude and phase to cancel said first current so that the ratio between the change in amplitude of said a.c. voltage signal and the electrostatic quantity of said surface is fixed by the ratio of the capacitance between said electrode and said surface and the change in said capacitance.

12. An electrostatic detector according to claim 8, wherein the time constant of the equivalent resistive load of said electrode is low as compared to the period of vibration of said electrode to provide for generation of a detector current.

13. An electrostatic detector according to claim 8, further including means for monitoring the voltage between said output and said second input of said amplifier.

14. An electrostatic detector according to claim 13, wherein said monitoring means comprises a differential amplifier having an inverting input, a non-inverting input and an output, said non-inverting input being connected to the output of said summing amplifier, said inverting input being connected to the non-inverting input of said summing amplifier, whereby the voltage at said output of said differential amplifier is alternating having a frequency equal to the rate of said capacitance modulation and having an amplitude proportional to the magnitude of the electrostatic quantity on said surface.

15. An electrostatic detector according to claim 8, further including means connected to said a.c. voltage applying means for monitoring the amplitude of said a.c. voltage.

16. An electrostatic detector according to claim 8, further including:
  (a) means for monitoring the voltage between said output and said second input of said amplifier; and
  (b) means connected to said a.c. voltage applying means for monitoring the amplitude of said a.c. voltage.

17. An electrostatic detector according to claim 16 wherein said monitoring means comprises a differential amplifier having an inverting input, a non-inverting input and an output, said non-inverting input being connected to the output of said summing amplifier, said inverting input being connected to the non-inverting input of said summing amplifier, whereby the voltage at said output of said differential amplifier is alternating having a frequency equal to the rate of said capacitance modulation and having an amplitude and phase proportional to the magnitude and polarity of the electrostatic quantity on said surface.

18. A non-contacting electrostatic detector comprising:
  (a) a detector electrode sensitive to electrostatic quantities such as electrostatic fields, voltages and charges;
  (b) modulator means operatively coupled to said electrode for moving said electrode relative to a surface bearing an electrostatic quantity to which said electrode is exposed to produce capacitive modulation of the physical capacitance between said electrode and said surface;
  (c) an amplifier having first and second inputs and an output, said first input being an inverting input serving as a summing node and said second input being a non-inverting input;
  (d) means for connecting said electrode to said first input of said amplifier;
  (e) said amplifier being connected as a summing amplifier by an impedance connected between said output and said first input;
  (f) means for applying an a.c. voltage signal to said second input of said amplifier, said a.c. voltage having a frequency equal to the frequency of said modulator means;
  (g) said means for applying an a.c. voltage signal comprising a differential amplifier having an inverting input, a non-inverting input and an output, said non-inverting input being connected to the output of said summing amplifier, said inverting input being connected to the non-inverting input of said summing amplifier, whereby the voltage at said output of said differential amplifier is alternating having a frequency equal to the rate of said capacitance modulation and having an amplitude proportional to the magnitude of the net current flow through said impedance; and an a.c. amplifier having an input connected to the output of said differential amplifier and an output connected to said non-inverting input of said summing amplifier; whereby the output of said a.c. amplifier applies to said non-inverting input of said summing amplifier an alternating voltage having a frequency equal to the rate of said capacitance modulation and having an amplitude and phase to cause the amplitude of the net current flow through said impedance to be nulled to zero;
  (h) whereby when the amplitude and phase of said a.c. voltage signal have values resulting in zero net current flow through said impedance, said amplitude and phase values are proportional to the magnitude and polarity of said electrostatic quantity on said surface.

19. An electrostatic detector according to claim 18 further including means connected to the output of said a.c. amplifier for monitoring the amplitude of said a.c. voltage signal whereby the amplitude of said a.c. voltage signal is proportional to the amplitude of the electrostatic quantity on said surface.

20. An electrostatic detector according to claim 18 wherein said a.c. amplifier is a tuned amplifier having bandpass characteristics around a frequency equal to the rate of said capacitance modulation.

21. A non-contacting electrostatic detector comprising:
  (a) a detector electrode sensitive to electrostatic quantities such as electrostatic fields, voltages and charges;
  (b) modulator means operatively coupled to said electrode for moving said electrode relative to a surface bearing an electrostatic quantity to which said electrode is exposed to produce capacitive modulation of the physical capacitance between said electrode and said surface;
  (c) an amplifier having first and second inputs and an output, said first input being an inverting input serving as a summing node and said second input being a non-inverting input;
  (d) means for connecting said electrode to said first input of said amplifier;
  (e) said amplifier being connected as a summing amplifier by an impedance connected between said output and said first input;
  (f) means connected to the output of said summing amplifier and to said second input of said summing amplifier for monitoring the voltage across said impedance and having an output providing an indication of the currents flowing therethrough;
  (g) phase sensitive demodulator means having an output, a first input connected to the output of said monitoring means and a second input connected to said modulator means to obtain a signal correlated in frequency and phase with the motion of said electrode, said demodulator means producing an output signal proportional to the difference between currents flowing in said impedance; and
  (h) feedback voltage generating means having an input connected to the output of said demodulator means and having an output connected to said second input of said summing amplifier for providing an alternating voltage having an amplitude sufficient to null the output of said monitoring means;

(i) whereby the amplitude of said alternating feedback voltage is proportional to the amplitude of said electrostatic quantity.

22. An electrostatic detector according to claim 21, further including means connected to the output of said feedback voltage generating means for monitoring the amplitude of said feedback voltage to provide information as to the amplitude of said electrostatic quantity.

23. An electrostatic detector according to claim 21, wherein said feedback voltage generating means comprises:
(a) a high gain integrating amplifier having an input connected to the output of said demodulator means and having an output;
(b) a variable gain inverting amplifier having an output, an input connected to said modulator means to obtain a signal which is frequency and phase correlated with the capacitance modulation, and a d.c. control input connected to the output of said integrating amplifier;
(c) a second summing amplifier having an output connected to the second input of said first-named summing amplifier and having an input;
(d) means for connecting the output of said inverting amplifier to the input of said second summing amplifier; and
(e) means for connecting said modulator means to said input of said second summing amplifier to provide an input signal to said second summing amplifier which is frequency and phase correlated with the capacitance modulation.

24. An electrostatic detector according to claim 23, further including means connected to the output of said second summing amplifier for monitoring the amplitude of the output of said second summing amplifier to provide information as to the amplitude of said electrostatic quantity.

25. A probe for a non-contacting electrostatic detector comprising:
(a) a housing having an opening therein adapted to be disposed toward a surface bearing an electrostatic quantity to be measured;
(b) a detector electrode in said housing and sensitive to said electrostatic quantity; said electrode being exposed to said surface through said opening;
(c) electromechanical transducer means connected to said electrode for moving said electrode relative to said surface to produce capacitive modulation of the physical capacitance between said electrode and said surface;
(d) means for applying a driving signal to said transducer means;
(e) sensing means connected to said transducer means for deriving a signal having frequency and phase information regarding the variation of the position of said electrode relative to time;
(f) an amplifier carried by said housing having first and second inputs and an output, said first input being an inverting input serving as a summing node and said second input being a non-inverting input;
(g) means for connecting said electrode to said first input of said amplifier;
(h) said amplifier being connected as a summing amplifier by an impedance connected between said output and said first input;
(i) means for connecting the output of said amplifier means and said second input of said amplifier means to means for monitoring the voltage across said resistance; and
(j) means for applying an a.c. voltage signal to said second input of said amplifier, said a.c. voltage having a frequency equal to the frequency of said modulator means;
(k) whereby when the amplitude of said a.c. voltage signal has a value resulting in zero net current flow through said resistance, said amplitude value is proportion to the magnitude of said electrostatic quantity.

26. A probe according to claim 25, further including means connected to said driving signal applying means and to said sensing means for providing a gain controlled feedback loop to cause oscillation of said transducer means at its mechanical resonant frequency.

27. A probe according to claim 25, further including control means connected to said driving signal applying means and to said sensing means for controlling the amplitude of said driving signal to provide for constant peak to peak excursion of said electrode to maintain a fixed ratio of the capacitance between said electrode and said surface and the change in said capacitance to provide a fixed proportional relationship between the magnitude of said electrostatic quantity on said surface and the amplitude of said a.c. voltage signal.

28. A probe according to claim 27, wherein said control means comprises:
(a) a signal amplifier having an input connected to said sensing means and an output;
(b) a d.c. gain controlled amplifier having an output connected to said driving signal applying means;
(c) means for connecting the output of said signal amplifier to an input of said d.c. gain controlled amplifier; and
(d) signal processing means connected to the output of said signal amplifier and connected in controlling relation to said d.c. gain controlled amplifier for peak detecting the output of said signal amplifier and comparing the peak detected result with a reference and applying the difference as a control signal to said d.c. gain controlled amplifier.

29. A probe according to claim 28 wherein said signal processing means comprises:
(a) a peak detector having an input connected to the output of said signal amplifier and having an output;
(b) a source of reference voltage having an output;
(c) an integrating amplifier having an output connected in controlling relation to said d.c. gain controlled amplifier; and
(d) means for connecting the outputs of said peak detector and said source of reference voltage to the input of said integrating amplifier.

30. In a non-contacting electrostatic detector including a detector electrode adapted to be exposed to a surface bearing an electrostatic quantity to be measured, electromechanical transducer means connected to said electrode for moving said electrode relative to said surface to produce capacitive modulation of the physical capacitance between said electrode and said surface means for applying a driving signal to said transducer means and sensing means connected to said transducer means for deriving a signal having frequency and phase information regarding the variation of the position of said electrode relative to time, the improvement comprising:

control means connected to said driving signal applying means and to said sensing means for controlling the amplitude of said driving signal to provide for constant peak to peak excursion of said electrode to maintain a fixed ratio of the capacitance between said electrode and said surface and the change in said capacitance.

31. The improvement according to claim 30, wherein said control means comprises:
   (a) a signal amplifier having an input connected to said sensing means and an output;
   (b) a d.c. gain controlled amplifier having an output connected to said driving signal applying means;
   (c) means for connecting the output of said signal amplifier to an input of said d.c. gain controlled amplifier; and
   (d) signal processing means connected to the output of said signal amplifier and connected in controlling relation to said d.c. gain controlled amplifier for peak detecting the output of said signal amplifier and comparing the peak detected result with a reference and applying the difference as a control signal to said d.c. gain controlled amplifier.

32. The improvement according to claim 31 wherein said signal processing means comprises:
   (a) peak detector having an input connected to the output of said signal amplifier and having an output;
   (b) a source of reference voltage having an output;
   (c) an integrating amplifier having an output connected in controlling relation to said d.c. gain controlled amplifier; and
   (d) means for connecting the outputs of said peak detector and said source of reference voltage to the input of said integrating amplifier.

* * * * *